(12) United States Patent
Venkataranan et al.

(10) Patent No.: US 6,300,255 B1
(45) Date of Patent: Oct. 9, 2001

(54) METHOD AND APPARATUS FOR PROCESSING SEMICONDUCTIVE WAFERS

(75) Inventors: Shankar Venkataranan, Santa Clara; Scott Hendrickson, San Jose; Inna Shmurun, Foster City; Son T. Nguyen, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/257,467

(22) Filed: Feb. 24, 1999

(51) Int. Cl.[7] .......................... H01L 21/31; H01L 21/469
(52) U.S. Cl. ............................. 438/787; 438/509
(58) Field of Search .................... 438/680, 683, 438/783, 787, 905, 488, 541, 758, 503, 509, 514, 530, 765; 364/468.28; 134/1, 1.1, 1.2

(56) References Cited

U.S. PATENT DOCUMENTS 5,812,403 * 9/1998 Fong et al. ..................... 364/468
5,817,576 * 10/1998 Tseng et al. .................... 438/680
5,976,260 * 11/1999 Kinoshita et al. ............... 118/719

\* cited by examiner

Primary Examiner—David Nelms
Assistant Examiner—Phuc T. Dang
(74) Attorney, Agent, or Firm—Ostroff & Associates

(57) ABSTRACT

There are provided a method and apparatus for forming by chemical vapor deposition on large diameter (e.g., 300 mm) semiconductive wafers thin insulating layers of silicon oxide ($SiO_2$) having high uniformity from rim to rim across any diameter through the centers of the wafers. Such high degree of uniformity of the layers is obtained by directing separately a first reactive gas stream and a second reactive gas stream into close proximity to an exposed surface of a wafer to a be coated by the gasses with an insulating layer, the gas streams when mixed together reacting with each other to deposit an insulating layer on a wafer; forming a whirlpool-like swirling mixture of the first and second gas streams to thoroughly mix together the gasses thereof; forming a highly uniform mixture of the reactive gasses; and promptly flowing the mixture of reactive gasses over and upon the surface of the wafer. The apparatus also provides dual wafer processing chamber cavities.

11 Claims, 4 Drawing Sheets

METHOD AND APPARATUS FOR PROCESSING SEMICONDUCTIVE WAFERS

FIELD OF THE INVENTION

This invention relates to the processing of large diameter semiconductive wafers into integrated circuits (and similar devices) wherein the wafers are put through a series of processing steps, one or more of which steps involve depositing on an exposed surface of each wafer a thin, uniform insulating layer or layers of silicon oxide ($SiO_2$) by means of chemical reactions of mixed gasses (well known in the art) to which the wafers are exposed. A commonly used process is known as sub-atmospheric chemical vapor deposition (SACVD)™.

BACKGROUND OF THE INVENTION

The processing of semiconductive wafers (e.g., thin discs of single-crystal silicon) into various integrated circuits (and similar devices) is well known in the art. To this end manufacturers offer throughout the world various makes and designs of equipment for this purpose. Because of the precision in construction and of operation required of such equipment, and the uniformity in processing necessary to obtain a high yield within specifications of devices being produced, the equipment is expensive to build and to operate. It is highly desirable therefore that the capital and operating costs of such equipment, for a given production throughput, be reduced as much as possible.

Recently semiconductive wafers with a diameter of 300 mm (0.3 meter) have become available to the manufacturers of integrated circuits. Compared to previously available 200 mm wafers (or even smaller ones), a 300 mm wafer offers a potential gain in productivity of more than two to one. Use of 300 mm wafers is thus highly attractive from a cost standpoint.

In a SACVD™ process step where silicon oxide is being deposited as insulation on a wafer, reactive gasses (well known in the art such as an organic vapor in helium or nitrogen, and ozone) are separately mixed together very close to where they will be used, then immediately introduced into a hermetically sealed chamber. The mixed gasses flow into a chamber at desired pressure and flow rate and are continuously exhausted from the chamber by a pump. A wafer within the chamber is held at a desired temperature (e.g., in the range of 200 to 800° C.) while the reactive gasses flow over an exposed surface of the wafer and in so doing deposit thereon a thin layer of silicon oxide insulation. Since the layer of silicon oxide being deposited onto the wafer should be as uniform as possible over the entire wafer surface from center to rim, the reactive gas stream should have its component gasses thoroughly mixed together before impinging on the wafer, and the mixed gasses should flow with perfect, or near perfect, uniformity over the entire area of the exposed surface of the wafer.

Non-uniformity in mixing and/or flow of the reactive gasses results in an insulating layer ($SiO_2$) being deposited unevenly onto the wafer. The resulting layer is thus thicker, or thinner, in some places than in others. When even small peaks and/or valleys begin to show up in an insulating layer the integrated circuits (or similar devices) which are being produced on the wafer can be rendered defective and thus become scrap. It becomes however, more and more difficult to achieve absolute uniformity in the mixing and flowing of larger volumes of the reactive gasses as the area of a wafer is made larger and larger (e.g., from a diameter of 200 mm to a diameter of 300 mm or greater). Thus, in practical effect, processing apparatus intended for 200 mm wafers cannot merely be scaled up in size so that it is big enough to handle 300 mm wafers and still produce integrated circuits having zero, or nearly zero defects. Substantial modifications in the apparatus are required. The present invention in one of its aspects provides an effective and economical solution to this problem of achieving uniform processing in chambers for large diameter wafer (e.g., 300 mm).

Previously, where wafer diameters were much smaller, there have been attempts to combine two wafer-processing chamber cavites into a single piece of equipment. Thus common usage could be made of certain elements of equipment such as housing, platform, gas supplies, control circuits, etc. The provision of dual-cavity chamber equipment would therefore offer increased production throughput along with substantial savings in capital cost. But problems of uniform processing, as discussed above have, among other reasons, precluded dual-cavity chamber equipment suitable for 300 mm wafers. The present invention in another of its aspects makes possible dual-cavity chamber apparatus capable of processing two such semiconductor wafers simultaneously.

SUMMARY OF THE INVENTION

In accordance with one aspect of the invention there is provided a method of mixing together two separate streams of gasses which react together, and then promptly flowing them into a wafer-processing chamber in such a way that the reacting gasses will result in the deposition of a highly uniform layer of silicon oxide insulation onto a large diameter semiconductive wafer within the chamber. The wafer lies upon a heating element in the chamber and is maintained at a suitable elevated temperature while the walls of the chamber are kept at a much lower temperature by coolant fluid pumped around and within the walls thereof.

To achieve immediate and intimate mixing of the gasses in the separate streams, one stream is injected tangentially into a mixing block having a small vertical cavity, and the other stream is injected tangentially into the cavity in the opposite direction. This results in a vigorous stirring and mixing of the two gas streams as they enter the cavity. The now-mixed reactive gasses continually flow out of the mixing cavity down through a plurality of perforated gas dispersion plates, which evenly spread the gasses into a highly uniform mixture flowing over an area slightly larger than the area of the wafer. The dispersion plates are specially configured and mounted with respect to each other, the mixing cavity, and a wafer in order to obtain gas flow over the wafer with the necessary high degree of uniformity. The reactive gasses flow down upon and over an exposed upper surface of the wafer and are exhausted from the bottom of the chamber by an evacuation pump. After an insulating layer of desired thickness (and virtually perfect uniformity) has been deposited on the wafer, the wafer is removed from the chamber by an automatic mechanism (well known in the art) and cleaning gas is pumped into the chamber. The cleaning gas passes through the mixing cavity, the gas dispersion plates, and down through and out of the chamber. Chemical residues left over from a previous processing step or steps of forming an insulating layer are thus removed from the passages and walls of the chamber, and the equipment is thus readied for another wafer-processing step.

Viewed from one process aspect, the present invention is directed to a method of forming a layer of uniform thickness on a surface of a semiconductive wafer by chemical vapor deposition from a mixture of reactive gasses. The method comprises the steps of: forming from separate streams of first and second gases a whirlpool-like swirling mixture of the gases in close proximity to the semiconductive wafer on which a layer of uniform thickness is to be deposited; and forming from the mixture of gases a uniform mixture of the reactive gasses; and flowing the mixed reactive gasses over and upon the surface of the wafer so as to form a layer of uniform thickness on the surface of the semiconductive wafer.

Viewed from one apparatus aspect, the present invention is directed to apparatus for forming a layer of uniform thickness on a surface of a semiconductive wafer from reactive gasses. The apparatus comprises a housing defining a chamber therein configured to contain a semiconductive wafer during processing and a mixing block defining a gas mixing cavity. A first entrance of the mixing cavity receives a first reactive gas in one direction tangentially into the mixing cavity. A second entrance of the mixing cavity receives a second reactive gas into the mixing chamber in the opposite direction tangentially into the mixing cavity such that gasses flowing through the first and second entrances swirl around and mix together in the cavity. An exit of the mixing chamber is in close proximity to the semiconductor wafer. In a preferred embodiment the apparatus further comprises a blocker plate and shower head comprising first and second dispersion plates with each dispersion plate defining a plurality of holes therethrough, the first dispersion plate not having a perforation located at the center thereof. The first dispersion plate has perforations thereof located in close proximity to the exit of the mixing cavity and is located in close proximity to the second dispersion plate. The second dispersion plate has outlets in close proximity to the surface of the semiconductive wafer such that there is formed a layer of uniform thickness on the surface of the semiconductive wafer.

The invention will be better understood from the following more detailed description taken with the accompanying drawings and claims.

DETAILED DESCRIPTION

Figure 1:
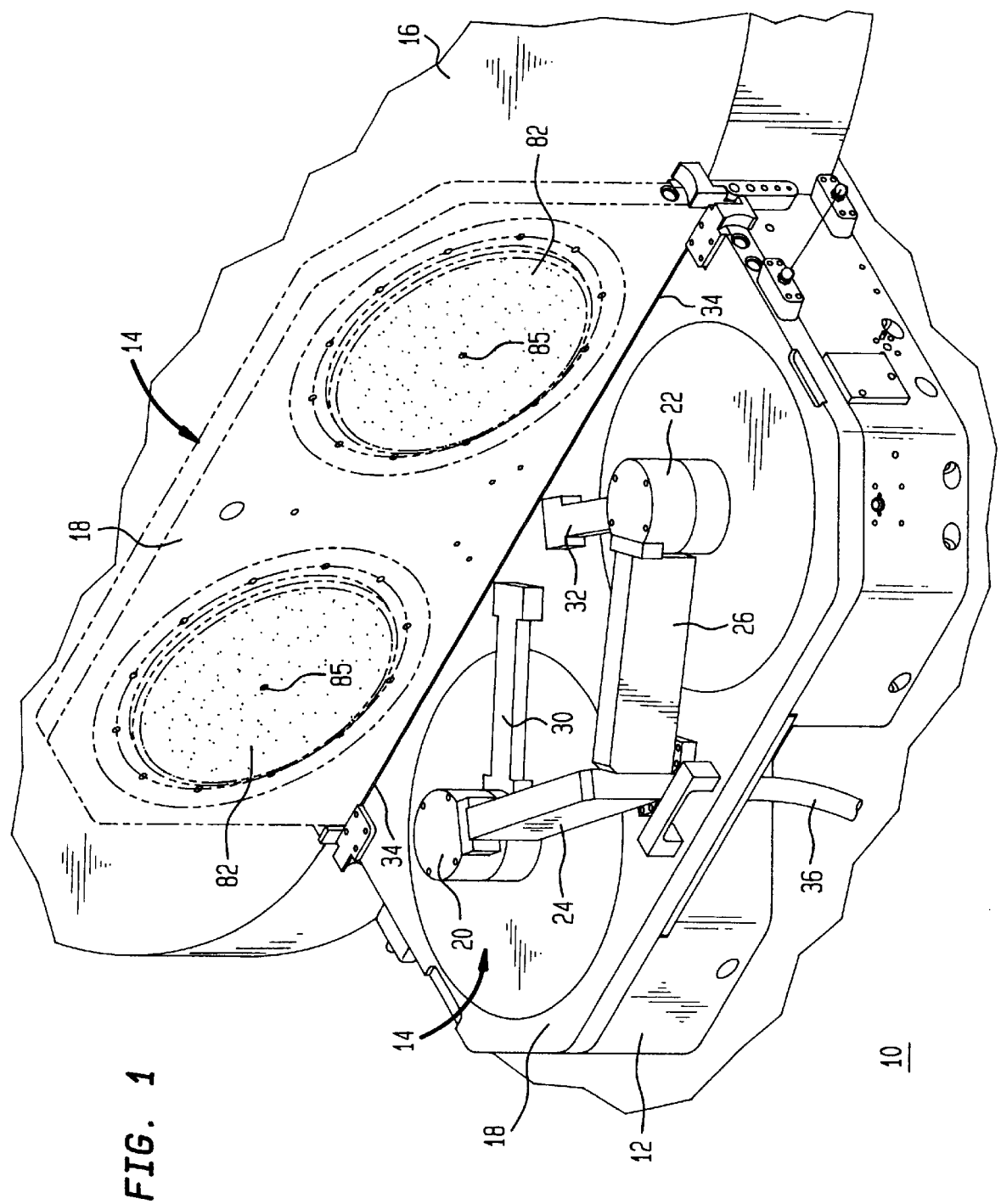
FIG. 1 is a perspective view, partially broken away, of a dual-cavity chamber, large diameter wafer-processing apparatus in accordance with the present invention.

Referring now to FIG. 1, there is shown apparatus 10 in accordance with the present invention. Apparatus 10 is useful for processing semiconductor wafers and comprises a chamber housing 12 (partially broken away) having a two cavity chamber (otherwise not shown), a lid assembly 14, and a platform 16 (partially broken away) containing an automatic mechanism (not shown). This mechanism inserts wafers into the respective chamber through horizontal slots (not shown) in the rear of the housing 12 and removes the wafers after a processing step. Such mechanism is well known and is not further described herein.

The lid assembly 14 comprises a frame plate 18, gas mixing blocks 20 and 22, a cleaning gas supply line 24 and a similar cleaning gas supply line 26, a reactive gas supply conduit 30 and a similar reactive gas supply conduit 32. The lid assembly 14, which is shown in closed position by solid lines and in open position by dashed lines, is hinged at 34 along its rear to the housing 12, and when closed (down position) provides a hermetic seal for the two separate wafer-processing cavities of the chamber (not shown) within the housing 12.

Each of the gas mixing blocks 20 and 22 is centered vertically over a respective chamber cavity within the housing 12. The block 20 is connected at its top to the gas line 24 which supplies (when required) a flow of cleaning gas (e.g., ionized $NF_3$) to the mixing block 20 and thence to a respective cavity of the chamber (not shown) beneath the lid assembly 14. A similar cleaning gas line 26 is connected to the top of the block 22. The other ends of the gas lines 24 and 26 are connected together to a common supply line 36 which is connected to a source (not shown) of ionized gas. Gas conduits 30 and 32 are connected to mixing blocks 20 and 22, respectively, and supply each with two separate streams of reactive gasses. Within each conduit 30 and 32 are a pair of separate gas lines (not shown) which apply the gasses unmixed to each block 20 and 22, as will be explained shortly. The other ends of the conduits 30 and 32 (and their respective internal gas lines) are connected to gas sources (not shown).

Figure 2:
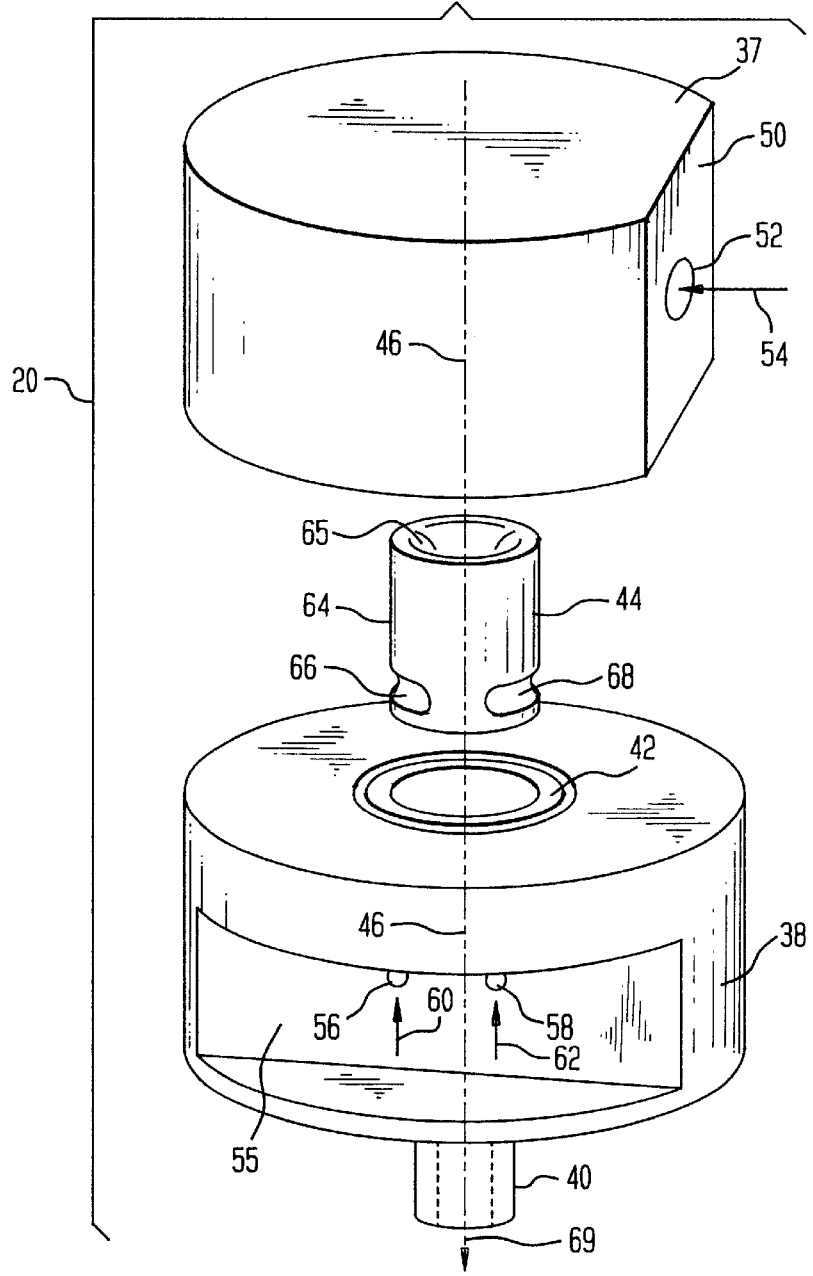
FIG. 2 is an exploded perspective view of a gas mixing block in accordance with the present invention.

Referring now to FIG. 2, there is shown an exploded view of one of the gas mixing blocks (i.e., the block 20). It is to be understood that the other block (i.e., the block 22) is substantially identical, though a mirror image. The block 20 comprises a top portion 37, a lower portion 38 which has a lower, hollow stub 40, an "O" ring 42, and a cylindrical member 44. The latter will nest within the lower block portion 38 when the portions 37 and 38 are put together along a vertical axis 46, as will be further explained shortly.

As seen in FIG. 2, the upper portion 37 of the mixing block 20 has a flat surface 50 which mates with an end of the cleaning gas line 24 (not shown here but shown in FIG. 1). An orifice 52 in the face 50 provides entrance to an internal passage (not shown here) in the upper portion 37 so that cleaning gas can enter into the mixing block, as indicated by an arrow 54, and flow down along the axis 46 into and through a respective wafer-processing chamber of the apparatus 10. The lower portion 38 of the mixing block 20 has an opening 55 which mates with an end of the gas conduit 30 (not shown here but shown in FIG. 1). A first orifice 56 and a second orifice 58 in the opening 55 of lower portion 38 provide entrances to separate internal passages (not shown here) in the lower portion 38. The reactive gasses supplied by the separate gas lines in the gas conduit 30 flow into these orifices 56 and 58, as indicated by the respective arrows 60 and 62.

Still referring to FIG. 2, the member 44 has a vertical cylindrical wall 64, and a central, gas mixing cavity 65 centered along the axis 46. Near the lower end of the member 44, on opposite sides thereof, are a first wall cutout 66 and a second wall cutout 68. Each of the cutouts 66 and 68 provides a tangential opening through the wall 64 into the gas mixing cavity 65. The respective streams of reactive gasses (indicated by the arrows 60 and 62 ) flow tangentially through these cutouts 66 and 68 and into the cavity 65 where the gasses are vigorously mixed together. The mixed gasses then immediately flow down through the hollow stub 40, as indicated by an arrow 69.

Figure 3:
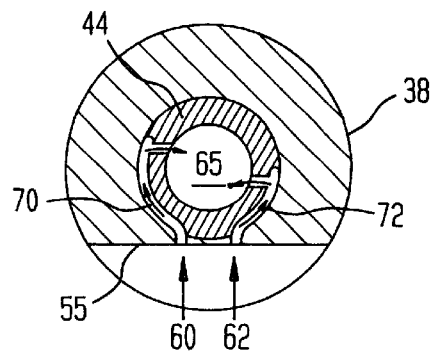
FIG. 3 is a schematic cross-sectional view of a center part of the mixing block showing a gas mixing cavity and separate reactive gas feed lines connected thereto.

Referring now to FIG. 3, there is shown a schematic cross-section of the nested cylindrical member 44 of the now assembled mixing block 20. The flow of one reactive gas stream, indicated by the arrow 60, is along an internal passage 70, which reverses the flow of this gas stream just before it tangentially flows through the cutout 66 (see also FIG. 2) in the member 44 into the cavity 65. The flow of the other reactive gas stream indicated by the arrow 62 is along a short internal passage 72 and flows tangentially through the cutout 68 into the cavity 65 in a direction opposite to that of the first stream. This gives rise to a vigorous whirlpool-like mixing and stirring of the two gas streams, which upon mixing immediately flow down through the hollow stub 40 as indicated by the arrow 69 in FIG. 2.

Figure 4:
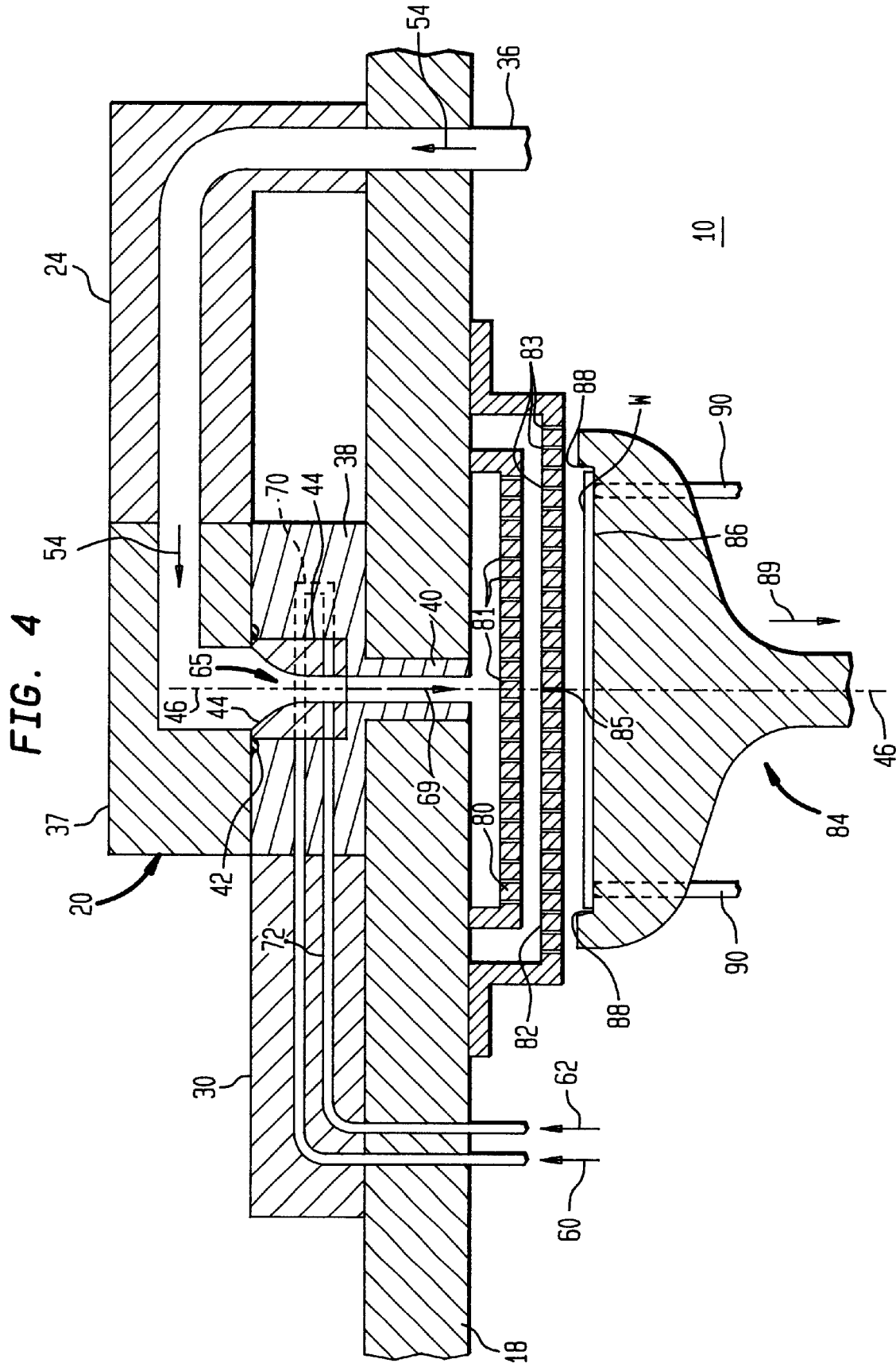
FIG. 4 is a schematic cross-section of a portion of the apparatus of FIG. 1 showing a mixing block and a respective set of gas diffusion plates attached to the underside of the lid, and also showing a heater assembly with a wafer thereon for processing within a chamber of the apparatus.

Referring now to FIG. 4, there is shown a schematic cross-section of a portion of the apparatus 10. There is shown a portion of the lid frame 18, the mixing block 20 and components thereof (see also FIG. 2), the gas line 24, and the gas conduit 30 which have previously been described. Also shown in FIG. 4 are a first gas diffusion (blocker) plate 80 perforated with holes 81, a second gas diffusion (face) plate (shower head), 82, perforated with holes 83 and a center hole 85, a heater assembly 84, and a large diameter semiconductive wafer W positioned on a top face 86 of the heater assembly 84. The blocker plate 80 and the face plate (shower head) 82 together serve as a means for flowing a highly uniform mixture of reactive gasses down onto a wafer W, as will be further explained hereinafter. It is to be noted that two face plates 82 are seen in dashed outline (lid open) in FIG. 1, there being a respective face plate 82 (and shower head) for each of the two chamber cavities (not shown) within the apparatus 10.

As seen in FIG. 4 the blocker plate 80 and the face plate 82 are attached by suitable means not otherwise described to an underside of the lid frame 18, and are centered on the vertical axis 46. The wafer W is automatically centered on this axis 46 by a tappered shoulder 88 around the rim of the heater face 86 which abuts the rim of the wafer W. The heater assembly 84 is in an "up" position so that the wafer W is properly held closely beneath the face plate 82 during processing. After a given processing step, the heater assembly is moved to a "down" position, as indicated by an arrow 89, (by a mechanism not shown) so that the wafer W may be removed from the chamber cavity and another wafer inserted. The heater assembly 84 has three or more lift fingers 90 (only two actually shown) underneath the wafer W which are raised up from the "down" position shown (by a mechanism not shown) to lift the wafer W above the heater face 86 and permit it to be easily removed from the chamber cavity in a way previously mentioned.

The reactive gasses, after being mixed together in the cavity 65, flow downward as indicated by the arrow 69 and are initially spread by the blocker plate 80 and its holes 81 over an area defined by the wafer W. The face plate 82, which has a much larger number of holes 83 through it than does the blocker plate 80, then further spreads the reactive gasses into a uniform mixture flowing down upon an upper, exposed face of the wafer W. The flowing reactive gasses are exhausted from a lower part of a respective chamber by a pump (not shown). The walls of each chamber, and the lid assembly 14 and lid frame 18, are maintained at a much lower temperature than that of the heater assembly 84 and the wafer W by the flow of coolant liquid through pipes and passages not shown.

Figure 5:
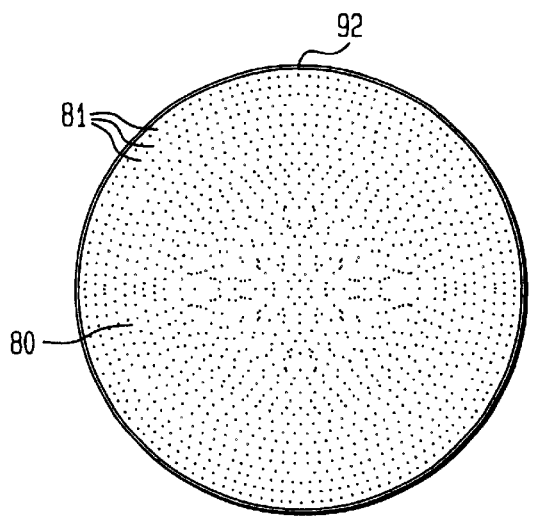
FIG. 5 is a schematic plan view of the upper one of the gas diffusion plates of FIG. 4.

Referring now to FIG. 5, there is shown a schematic plan view of the blocker plate 80 and the holes 81 through it (see also FIG. 4). The holes 81 are schematically illustrated here but in fact they are arranged on concentric circles in a specific pattern, provided in accordance with an aspect of the invention. The blocker plate 80 has a zero ("0") index indicated at 92 to which the holes 81 are referenced. The following Chart 1 gives the radial and angular positions, and the numbers of holes 81 in each circle in the blocker plate 80 in a specific embodiment of apparatus of the invention designed for processing 300 mm wafers W. The holes 81 are approximately 28 mils (thousandths of an inch) in diameter extending through the plate 80, which is about 0.3 inch thick. There are approximately 1310 of the holes 81 in total, but there is no hole in the center of the blocker plate 80. In an illustrative embodiment the holes are arranged evenly spaced along 28 concentric circles, the diameters of which are given in inches.

Hole Pattern Chart 1

| Circle No. | Diameter (inches) | # of Holes | Angle Offset Counter Clockwise in degrees from 0 Index |
| --- | --- | --- | --- |
| 1 | 0.750 | 8 | 22.50 |
| 2 | 1.250 | 8 | 0 |
| 3 | 1.500 | 7 | 6.00 |
| 4 | 1.750 | 8 | 0 |
| 5 | 2.000 | 9 | 10.00 |
| 6 | 2.250 | 11 | 0 |
| 7 | 2.500 | 11 | 16.50 |
| 8 | 2.750 | 14 | 6.00 |
| 9 | 3.050 | 17 | 10.50 |
| 10 | 3.350 | 19 | 0 |
| 11 | 3.650 | 20 | 9.00 |
| 12 | 3.950 | 26 | 0 |
| 13 | 4.350 | 33 | 5.50 |
| 14 | 4.750 | 36 | 4.00 |
| 15 | 5.150 | 38 | 5.00 |
| 16 | 5.550 | 44 | 0 |
| 17 | 6.000 | 51 | 2.00 |
| 18 | 6.450 | 54 | 0 |
| 19 | 6.900 | 58 | 3.00 |
| 20 | 7.350 | 62 | 0 |
| 21 | 7.850 | 73 | 5.00 |
| 22 | 8.350 | 78 | 0 |
| 23 | 8.850 | 82 | 2.00 |
| 24 | 9.350 | 87 | 0 |
| 25 | 9.900 | 101 | 3.00 |
| 26 | 10.450 | 107 | 0 |
| 27 | 11.000 | 124 | 5.00 |
| 28 | 11.550 | 130 | 0 |

Figure 6:
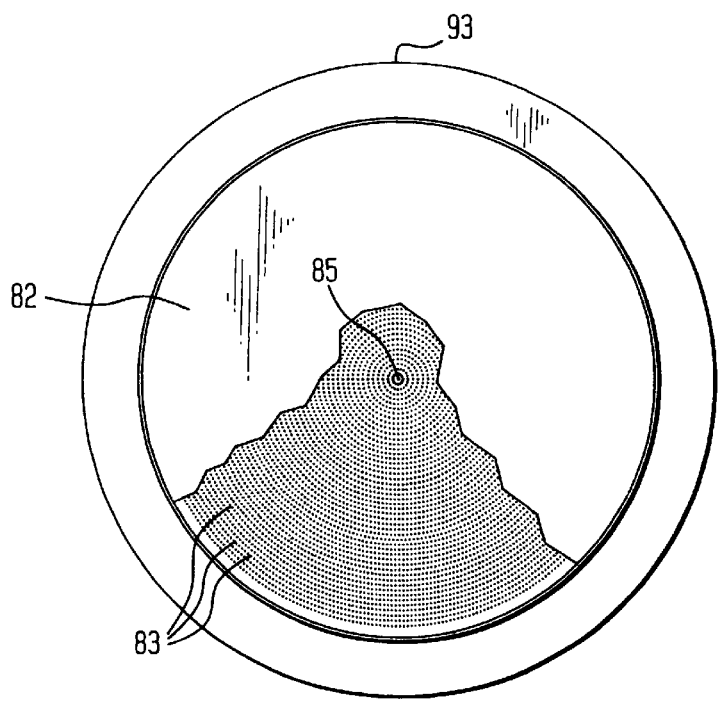
FIG. 6 is a schematic plane view of the lower one of the gas diffusion plates of FIG. 4.

Referring now to FIG. 6, there is shown a schematic plan view of the face plate 82 and the holes 83, and the center hole 85 there through (see also FIG. 4). The holes 83 (and hole 85 ) are schematically illustrated here but in fact they are arranged on concentric circles in a specific pattern, also provided in accordance with an aspect of the invention. The face plate 82 has a zero ("0") index indicated at 93 to which the holes 83 are referenced. This index 93 and the index 92 of the blocker plate 80 are aligned with each other when the face plate 82 and the blocker plate 80 are assembled together underneath the lid frame 18 (see FIG. 4). The following Chart 2 gives the radial and angular positions, and the numbers of holes 83 in each circle in the face plate 82 in the specific embodiment of apparatus 10 designed for processing 300 mm wafers W. In an illustrative embodiment the holes 83 are approximately 28 mils (thousandths of an inch) in diameter through the plate 82, which is about 0.6 inch thick. There are approximately 7350 of the holes 83 in total. The center hole 85 (of smaller diameter) passes through the center of the face plate 82 and is aligned with the vertical axis 46 (see FIG. 4). The holes 83 and the center hole 85 are arranged evenly spaced along 50 concentric circles (including the center), the diameters of which are given in inches. The holes 83 and the center hole 85 will be described in greater detail hereinafter.

Hole Pattern Chart 2

| Circle No. | Diameter (inches) | # of Holes | Angle Offset Counter Clockwise in degrees from 0 Index |
|---|---|---|---|
| 1 | center | 1 | 0 |
| 2 | 0.250 | 6 | 0 |
| 3 | 0.500 | 12 | 5 |
| 4 | 0.750 | 18 | 0 |
| 5 | 1.000 | 24 | 10 |
| 6 | 1.250 | 30 | 0 |
| 7 | 1.500 | 36 | 3 |
| 8 | 1.750 | 42 | 0 |
| 9 | 2.000 | 48 | 1 |
| 10 | 2.250 | 54 | 0 |
| 11 | 2.500 | 60 | 1 |
| 12 | 2.750 | 66 | 0 |
| 11 | 2.500 | 60 | 1 |
| 13 | 3.000 | 72 | 0 |
| 14 | 3.250 | 78 | 1 |
| 15 | 3.500 | 84 | 1 |
| 16 | 3.750 | 90 | 0 |
| 17 | 4.000 | 95 | 1 |
| 18 | 4.250 | 102 | 0 |
| 19 | 4.500 | 108 | 2 |
| 20 | 4.750 | 114 | 0 |
| 21 | 5.000 | 120 | 1 |
| 22 | 5.250 | 126 | 0 |
| 23 | 5.500 | 132 | 1 |
| 24 | 5.750 | 138 | 0 |
| 25 | 6.000 | 144 | 2 |
| 26 | 6.250 | 150 | 0 |
| 27 | 6.500 | 156 | 1 |
| 28 | 6.750 | 162 | 0 |
| 29 | 7.000 | 168 | 2 |
| 30 | 7.250 | 174 | 0 |
| 31 | 7.500 | 180 | 1 |
| 32 | 7.750 | 186 | 0 |
| 33 | 8.000 | 192 | 1 |
| 34 | 8.250 | 198 | 0 |
| 35 | 8.500 | 204 | 2 |
| 36 | 8.750 | 210 | 0 |
| 37 | 9.000 | 216 | 0 |
| 38 | 9.250 | 222 | 0 |
| 39 | 9.500 | 228 | 1 |
| 40 | 9.750 | 234 | 0 |
| 41 | 10.000 | 240 | 2 |
| 42 | 10.250 | 246 | 0 |
| 43 | 10.500 | 252 | 1 |
| 44 | 10.750 | 255 | 0 |
| 45 | 11.000 | 264 | 2 |
| 46 | 11.250 | 270 | 0 |
| 47 | 11.500 | 276 | 1 |
| 48 | 11.750 | 282 | 0 |
| 49 | 12.000 | 288 | 1 |
| 50 | 12.250 | 294 | 0 |

It should be noted that the last two hole circles, numbers 49 and 50, in the Chart 2 extend somewhat beyond the rim of a 300 mm diameter wafer W. This insures uniform flow of reactive gasses even beyond the rim of such wafers and is important in the depositing of highly uniform insulating layers by the reactive gasses. By way of example, a wafer W is held during processing about 50 mils below the bottom of the face plate 82.

Figure 7:
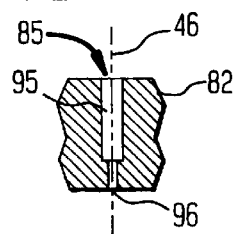
FIG. 7 is an enlarged vertical cross-section view of a hole through the center of the plate of FIG. 6.

Referring now to FIG. 7, there are shown in an enlarged vertical cross-section through a portion of the center of the face plate 82 details of the center hole 85. An upper part of the hole 85 has a first diameter bore at 95 extending through most but not all of the plate 82. The lower part of the hole 85 has a second diameter bore 96 through a remaining thickness of the plate 82. The first bore diameter is larger than the second bore diameter. The axis of the hole 85 coincides with the vertical axis 46. The smaller bore 96 of the hole 85 lies in the lower part of the face plate 82 just above a wafer W (see FIG. 4). By way of example, the smaller bore 96 of the center hole 85 has a diameter of about 23 mils, and the larger bore 95 a diameter of about twice this. The smaller bore 96 extends through about 0.1 inch thickness of the plate 82, the total thickness of which is about 0.6 inch. The holes 83 in the face plate 82 are closely similar in shape to that of the center hole 85, but the diameter of the smaller bore of the holes 83 is slightly larger (e.g., about 28 mils) than that of the bore 96 of the center hole 85. This dual-diameter somewhat funnel shape of the holes 83 and the center hole 85 insures high precision in the shape and exact locations of the holes, and this precision in turn contributes to obtaining virtually perfect uniformity in the insulating layers deposited on wafers W. Making the diameter of the smaller bore 96 of the center hole 85 slightly smaller than the corresponding diameter of the smaller bores of the holes 83 (e.g., 23 mils versus 28 mils) further contributes to obtaining uniformity of the insulating layers across the diameters of the wafers W.

The above description is intended in illustration and not in limitation of the invention. Various minor changes in the method and apparatus described may occur to those skilled in the art, and can be made without departing from the spirit or scope of the invention as set forth in the accompanying claims. For example, the invention is not limited to the processing of two wafers W at the same time or solely to the processing of wafers of 300 mm diameter. Also the exact numbers, sizes and shapes of the holes through the gas dispersion plates can be modified slightly to accommodate minor variations in wafer processing conditions. Furthermore, the exact sizes and shapes of the gas mixing blocks can be changed somewhat to accommodate such variations in processing conditions.

What is claimed is:

1. Apparatus for forming a layer of uniform thickness on a surface of a semiconductive wafer from reactive gasses comprising:
    a housing defining a chamber therein configured to contain a semiconductive wafer during processing;
    a mixing block defining a generally cylindrical gas mixing cavity aligned along an axis;
    a first entrance of the mixing cavity for receiving a first reactive gas in one direction tangentially into the mixing cavity;
    a second entrance for receiving a second reactive gas into the mixing cavity in the opposite direction tangentially into the mixing cavity, the first and second entrances lying in a plane generally at right angles relative to the axis, such that gasses flowing through the first and second entrances swirl around and mix together in the cavity; and
    an exit of the mixing cavity being in close proximity to the semiconductive wafer and being generally aligned with the axis and the wafer.

2. Apparatus for processing semiconductive wafers using reactive gasses to deposit on a surface of the semiconductive wafer a uniform layer, the apparatus comprising:

a housing defining a chamber therein configured to contain a wafer during processing;

a lid frame on top of the housing for forming a hermetic seal together with the housing around the chamber;

a heater assembly within the housing chamber for holding a wafer centered along a vertical axis and at elevated temperature during processing;

a mixing block affixed to the lid frame and having a gas mixing cavity generally aligned along the axis;

a first reactive gas supply coupled to a first entrance of the mixing chamber in one direction tangentially into the mixing cavity;

a second reactive gas supply coupled to a second entrance of the mixing cavity in the opposite direction tangentially into the mixing cavity, the entrances lying in a plane generally at right angles to the axis, such that gasses flowing through the first and second entrances swirl around and immediately mix together in the cavity;

gas spreading means having at least one perforated dispersion plate having an area approximately equal to the area of a wafer; and a pump for exhausting gasses from the mixing cavity, down through the gas spreading means, over the wafer and out of the chamber.

3. The apparatus of claim 2 wherein the gas spreading means comprises a blocker plate and a face plate closely spaced and indexed relative to each other, the blocker plate defining holes therethrough but not having a center hole, the face plate defining holes therethrough including a center hole aligned along the axis and with the center of the wafer and with the gas mixing cavity, such that semiconductive wafers as large as 300 mm in diameter have layers of uniform thickness formed on the surfaces thereof.

4. The apparatus of claim 3 wherein holes in the blocker plate are about 28 mils in diameter, and a center hole in the face plate is about 23 mils in diameter and the remaining holes are about 28 mils in diameter, the holes in the face plate being somewhat funnel shaped.

5. The apparatus of claim 4 wherein the holes in the blocker plate are arranged in a predetermined pattern given in Chart 1, and the holes in the face plate are arranged in a predetermined pattern given in Chart 2.

6. Apparatus for processing a semiconductive wafer having a diameter as large as 300 mm to form by sub-atmospheric chemical vapor deposition, using a mixture of reactive gasses, a silicon dioxide layer of uniform thickness on a surface of a semiconductive wafer, the apparatus comprising:

a housing enclosing a chamber for such processing of a wafer;

a lid assembly for forming together with the housing a hermetic seal of the chamber;

a heater assembly within the housing chamber for holding a wafer centered on a vertical axis in proper position and at elevated temperature for processing;

a gas mixing block affixed to the lid assembly and having a gas mixing cavity in line with the vertical axis and opening into the wafer chamber;

a first reactive gas supply line for injecting a first gas into the mixing cavity;

a second reactive gas supply line for injecting a second gas into the mixing cavity;

the first reactive gas supply line being coupled tangentially on one side of the mixing cavity and the second reactive supply gas line being coupled tangentially on the opposite side of the cavity and in opposite direction to the first line, such that the reactive gasses injected into the cavity swirl around and mix thoroughly together;

a perforated blocker plate affixed to the underside of the lid assembly just below the gas mixing cavity, the blocker plate spreading over an area approximately equal to that of the surface of the semiconductive wafer; and a perforated face plate affixed to the underside of the lid assembly closely beneath the blocker plate, the face plate spreading into a uniform mixture the reactive gasses over an area greater than that of a wafer, the blocker plate and the face plate being indexed relative to each other and the vertical axis, the blocker plate defining a plurality of holes therethrough but not including a center hole, and the face plate defining a center hole therethrough along the vertical axis and defining a plurality of other holes therethrough, the holes in the blocker plate and in the face plate being arranged in predetermined patterns such that a uniform layer of silicon dioxide is deposited on the surface of the semiconductive wafer.

7. The apparatus of claim 6 wherein the blocker plate has its holes arranged in accordance with Chart 1, and the face plate has its holes arranged in accordance with Chart 2, the center hole in the face plate having a diameter of about 23 mils, the remaining holes in the face plate and the holes in the blocker plate having diameters of about 28 mils.

8. The apparatus of claim 7 further comprising a cleaning gas supply line affixed to an upper part of the gas mixing block for flowing cleaning gas through the mixing cavity, blocker plate, face plate and wafer chamber to remove chemical residues of the reactive gasses after a wafer has been processed.

9. Apparatus for simultaneously processing two semiconductive wafers, each having a diameter as large as 300 mm, to apply by sub-atmospheric chemical vapor deposition, using a mixture of reactive gasses, a layer of uniform thickness of silicon oxide on respective surfaces of the semiconductive wafers, the apparatus comprising:

a housing enclosing a first and a second cavity of a chamber for such processing, each chamber cavity having a respective vertical axis;

a lid assembly for forming together with the housing a hermetic seal of each the chamber cavities; first and second heater assemblies, each such heater assembly being within a respective chamber cavity for holding a wafer centered on a respective vertical axis in proper position and at elevated temperature for processing;

a first and a second gas mixing block affixed to the lid assembly, each such block having a gas mixing cavity in line with a respective vertical axis and opening into a respective wafer chamber cavity;

a first reactive gas supply line for injecting a first gas into each of the mixing cavities, and a second reactive gas supply line for injecting a second gas into each of the mixing cavities, the first reactive gas line being located tangentially on one side of each mixing cavity and the second reactive gas line being located tangentially on the opposite side of each cavity and in opposite direction to the first line, such that the reactive gasses injected into a respective cavity swirl around therein and immediately mix thoroughly together;

a first and a second perforated blocker plate each of which is affixed to the underside of the lid assembly just below a respective gas mixing cavity, each blocker plate spreading over an area approximately equal to that of a wafer mixed reactive gasses flowing from a respective mixing cavity; and a first and a second perforated face plate, each of which is affixed to the underside of the lid assembly closely beneath a respective blocker plate, each face plate spreading into a uniform mixture the reactive gasses over an area greater than that of a wafer, a respective blocker plate and face plate being indexed relative to each other and a respective vertical axis, each blocker plate defining a plurality of holes therethrough but not having a center hole, and each face plate defining a center hole and a plurality of holes therethrough, the holes in the blocker plates and in the face plates being arranged in predetermined patterns such that uniform layers of silicon are deposited the surface of each semiconductive wafer being processed.

10. The apparatus of claim 9 wherein each blocker plate has its holes arranged in accordance with Chart 1, and each face plate has its holes arranged in accordance with Chart 2, the center hole in each face plate having a diameter of about 23 mils, the remaining holes in the face plates and the holes in the blocker plate having diameters of about 28 mils.

11. The apparatus of claim 10 in further combination with a cleaning gas supply line affixed to an upper part of each of the gas mixing blocks for flowing cleaning gas through the respective mixing cavities, blocker plates, face plates and wafer chambers to remove chemical residues of the reactive gasses after a wafer has been processed.

* * * * *